United States Patent

Brown et al.

[11] Patent Number: 5,831,925
[45] Date of Patent: Nov. 3, 1998

[54] MEMORY CONFIGURATION CIRCUIT AND METHOD

[75] Inventors: David R. Brown, Sugar Land, Tex.; Shoji Wada, Tokyo, Japan; Kazuya Ito, Hamura, Japan; Yasuhito Ichimura, Ibaraki, Japan; Ken Saitoh, Akishima, Japan

[73] Assignee: Texas Instruments Incorporated, Dallas, Tex.

[21] Appl. No.: 982,672

[22] Filed: Dec. 2, 1997

Related U.S. Application Data

[60] Provisional application No. 60/032,330 Dec. 3, 1996.
[51] Int. Cl.⁶ .................................. G11C 8/00; G11C 7/00
[52] U.S. Cl. .............................. 365/230.03; 365/230.06; 365/189.08
[58] Field of Search .................... 365/230.03, 230.06, 365/189.08

[56] References Cited

U.S. PATENT DOCUMENTS

| | | | |
|---|---|---|---|
| 4,354,256 | 10/1982 | Miyasaku | 365/230.03 |
| 5,161,124 | 11/1992 | Love | 365/51 |
| 5,483,497 | 1/1996 | Mochizuki et al. | 365/230.03 |
| 5,596,740 | 1/1997 | Quattromani et al. | 365/230.03 |
| 5,619,471 | 4/1997 | Nunziata | 365/230.03 |

FOREIGN PATENT DOCUMENTS

| | | |
|---|---|---|
| 61-16095 | 1/1986 | Japan . |
| 62-54949 | 3/1987 | Japan . |

Primary Examiner—David Nelms
Assistant Examiner—Trong Phan
Attorney, Agent, or Firm—Robert N. Rountree; Michael K. Skrehot; Richard L. Dinaldson

[57] ABSTRACT

A memory circuit includes a bond option circuit 106 having an input and an output, and row control circuitry 100 coupled to the output of the bond option circuit, the row control circuitry including address terminals, A12 and A13. The memory circuit also includes column control circuitry 102 coupled to the output of the bond option circuit, the column control circuitry 102 also including address terminals, A12 and A13. A memory cell array is coupled to the row control and column control circuitry and is arranged in a first plurality of banks of memory cells, the banks being selectable by a combination of address signals on the address terminals of the row control and column control circuitry. In response to a first signal at the input of the bond option circuit 106, the bond option circuit produces a second signal at the output of the bond option circuit that is coupled to the row control 100 and column control 102 circuitry. In response to the second signal, the row control and column control circuitry makes the banks of the array selectable in a second plurality. For example, the array may originally be arranged in four banks, but by the placing the proper signal at the input of the bond option circuit, the array is selectable as a two-bank array.

20 Claims, 8 Drawing Sheets

MEMORY CONFIGURATION CIRCUIT AND METHOD

This application claims priority under 35 U.S.C.§ 119(e)(1) of provisional application Ser. No. 60/032,330, filed Dec. 03, 1996.

FIELD OF THE INVENTION

This invention relates generally to memory integrated circuits, and more specifically to dynamic random access memory integrated circuits.

BACKGROUND OF THE INVENTION

Dynamic random access memory circuits (DRAMs) are used in computers and other electronic machines requiring temporary storage of data. These circuits have advantages over other types of memory circuits in that they provide the greatest density of memory cells for a given area of semiconductor, a low relative cost-per-bit of stored data, and relatively high speed. DRAMs have increased in both size and in operating speed to match the demands of system designers using modem microprocessors, which often have clock rates in excess of 100 MHz. Indeed, with each new generation of DRAM, the number of memory cells on the integrated circuit increases by a factor of four. In an effort to accommodate systems that demand more and faster data, the industry has turned to DRAMs that synchronize the transfer of data, addresses, and control signals with a clock signal, one that is typically tied to the microprocessor if the system is a computer.

Synchronous DRAMs have a multiple-bank internal organization to provide for maximum utilization of the high-speed interface characteristics of this type of memory circuit. Each bank comprises a memory cell array with its own row decoders and sense amplifiers. The banks share the column address latch, counter, and decoders; the row address latch and refresh counter; the data input-output buffers; the control block; and a mode register. The use of multiple banks improves the sustained bandwidth of the memory circuit, that is, the average rate of flow of data in and out of the memory circuit. This improvement is due in part to the fact that once the banks have been row-accessed, successive column accesses can alternate between the two banks. Read and write operations to the banks can be arranged so that gaps between the end of one transfer and the start of the next are minimized. The improvement in sustained memory bandwidth is also due to the ability of a synchronous DRAM to handle a row access to one bank while the column accesses to another bank are being carried out, a feature that is particularly useful when long bursts of data are transferred to or from the array. Thus, by using long data bursts and alternating row accesses between the banks, the memory circuit data bus can be kept almost completely utilized.

While, in general, the ability to sustain a high bandwidth is improved with more banks, the use of more banks increases the likelihood that the memory cell addressed next in a string of addresses will come from a different bank than the one currently accessed. In addition, an increased number of banks might require a more complex memory controller. Hence, in some applications a choice of configuration in which the memory is arranged in two banks, for example, rather than four might be more attractive. A need exists in the industry for circuits and methods that allow a memory to be configured simply and economically. Aspects of the present invention address this need.

SUMMARY OF THE INVENTION

In accordance with a first preferred embodiment of the invention, there is disclosed a memory circuit. The memory circuit includes a bond option circuit having an input and an output, and row control circuitry coupled to the output of the bond option circuit, the row control circuitry including address terminals. The memory circuit also includes column control circuitry coupled to the output of the bond option circuit, the column control circuitry also including address terminals. A memory cell array is coupled to the row control and column control circuitry and is arranged in a first plurality of banks of memory cells, the banks being selectable by a combination of address signals on the address terminals of the row control and column control circuitry. In response to a first signal at the input of the bond option circuit, the bond option circuit produces a second signal at the output of the bond option circuit that is coupled to the row control and column control circuitry. In response to the second signal, the row control and column control circuitry make the banks of the array selectable in a second plurality. For example, the array may originally be arranged in four banks, but by placing the proper signal at the input of the bond option circuit, the array is selectable as a two-bank array.

An advantage of the present invention is that the memory architecture, that is, the number of banks of memory cells, is selectable by a single bond wire connection late in the manufacturing process just prior to packaging. Thus, the memory circuit can be configured at a point in the fabrication process to allow the circuit to reach the market in a configuration desired by the market without undue delay.

BRIEF DESCRIPTION OF THE DRAWINGS

The foregoing features of the present invention may be more fully understood from the following detailed description, read in conjunction with the accompanying drawings, wherein:

FIGS. 7(A)–7(Z) is a timing diagram showing the progression of signals through the circuit of FIG. 6 for activating the COWE signal for bank 1.

DETAILED DESCRIPTION OF PREFERRED EMBODIMENTS

Figure 1:
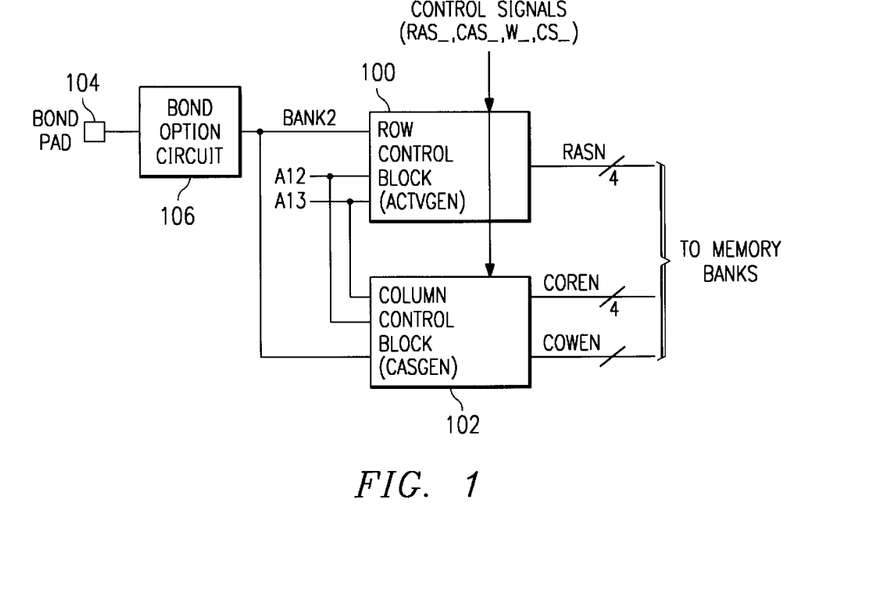
FIG. 1 is a generalized block diagram of a first preferred embodiment circuit.

FIG. 1 is a generalized block diagram of a first preferred embodiment in accordance with the invention. In this embodiment a 64 Mb memory array is configured in four banks of 16 Mb. Addresses 12 and 13 determine which of the four banks is accessed in a read or write operation by controlling the circuitry in the row control block 100, ACTVGEN, and the column control block 102, CASGEN, which generate bank-specific row-address-strobe (RAS), read (CORE), and write (COWE) signals, respectively. If it is desired that the array be divided into two banks instead of four, the array can be reconfigured prior to packaging by simply connecting bond pad 104 to a high logic voltage such as V$_{dd}$ (typically about 3.3 Volts). Bond option circuit 106 produces signal BANK2 in response to the connection of the bond pad 104 to V$_{dd}$. BANK2 directs the row control block 100, ACTVGEN, and the column control block 102, CASGEN, to treat address 13 as the bank select for selecting between a new first bank comprising the former first and second banks, and a new second bank comprising the former third and fourth banks. The address 12, which is used in conjunction with address 13 to select between banks in the four-bank arrangement, becomes a portion of the row address in the two-bank arrangement. Thus, a memory array originally arranged in four-banks can be made to function as if divided into two banks.

Figure 2:
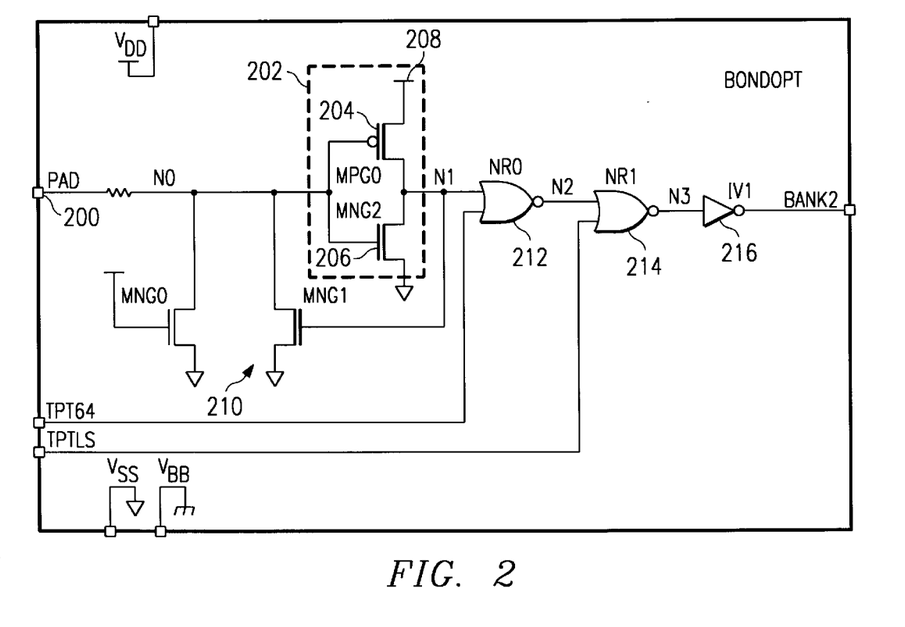
FIG. 2 is a schematic diagram of the bond option circuit of FIG. 1.

FIG. 2 is a schematic diagram of the bond option circuit 106 shown in FIG. 1. If bond pad 200 is not biased, that is, if it is left floating, the voltage at node N0 is such that the source-to-gate voltage of the p-channel transistor 204 is greater than the threshold voltage of that transistor. Hence, the p-channel transistor 204 is "on". Under the same conditions, the n-channel transistor 206 is "off". Consequently, the voltage at node N1 is essentially the bias voltage at node 208, or about 3.3 Volts (logic high). This condition is reinforced in that node N1 is tied to the gate of transistor 210. The high voltage at N1 as a result of floating the bias pad 200 turns the transistor 210 on and keeps node N0 at a logic low voltage until that condition is changed by connecting bond pad 200 to a higher voltage. The logic high at N1 is inverted by NOR gates 212 and 214, and inverter 216 such that the signal BANK2 is a logic low. Hence, in the as-manufactured (unbonded) state, the circuit produces a logic low and the memory remains in a four-bank configuration. The TPT64 and TPTLS signal lines shown in FIG. 2 are test signals that may be assumed to be logic lows while the memory is in its conventional operating mode, but which allow the toggling of BANK2 to test the bank reconfiguration circuitry when desired.

Figure 3:
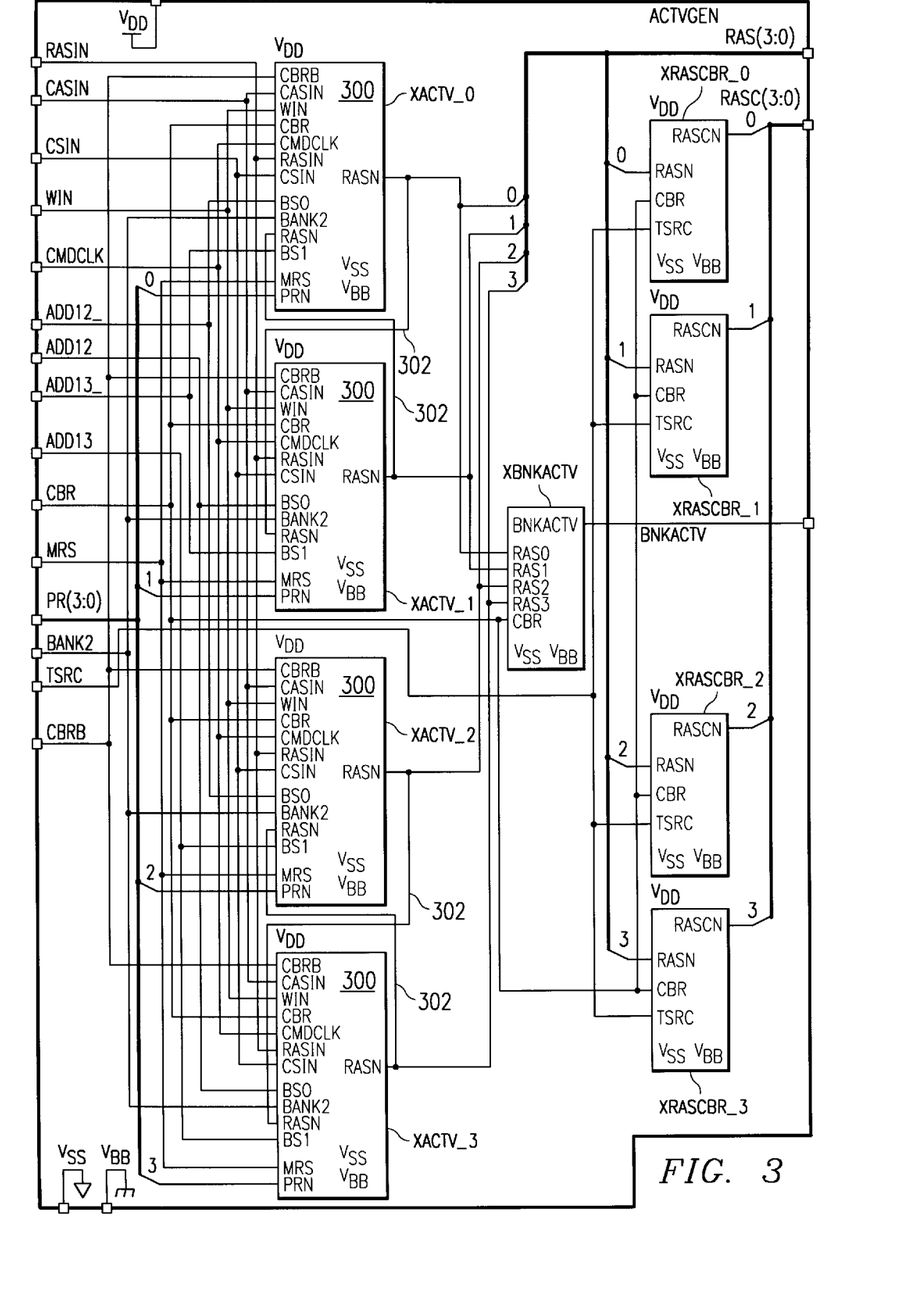
FIG. 3 is a schematic diagram of the row control block of FIG. 1.
Figures 4, 4A:
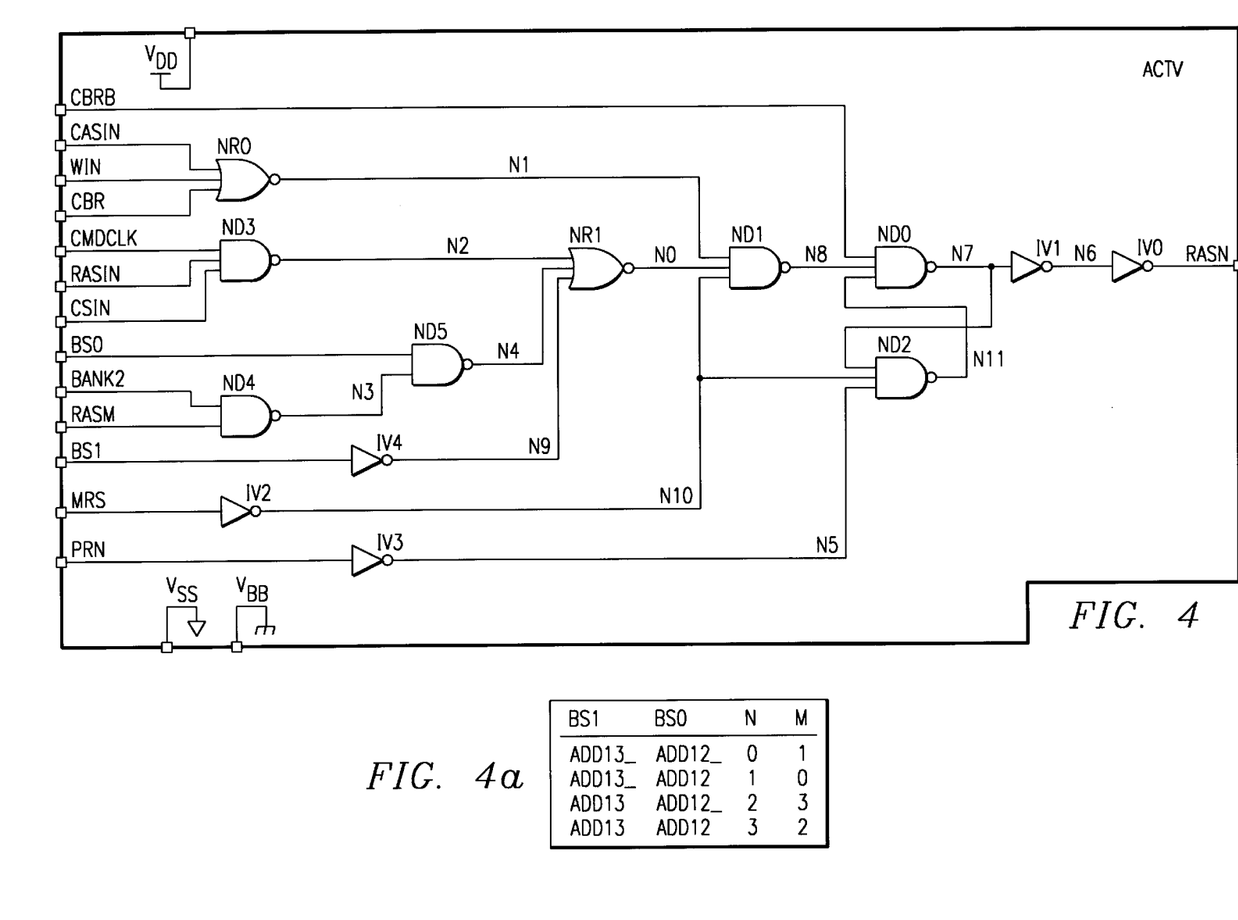
FIG. 4 is schematic diagram of the XACTV circuits of FIG. 3.
FIG. 4a is a truth or connection table for addressing the circuit of FIG. 4.
Figure 5A:
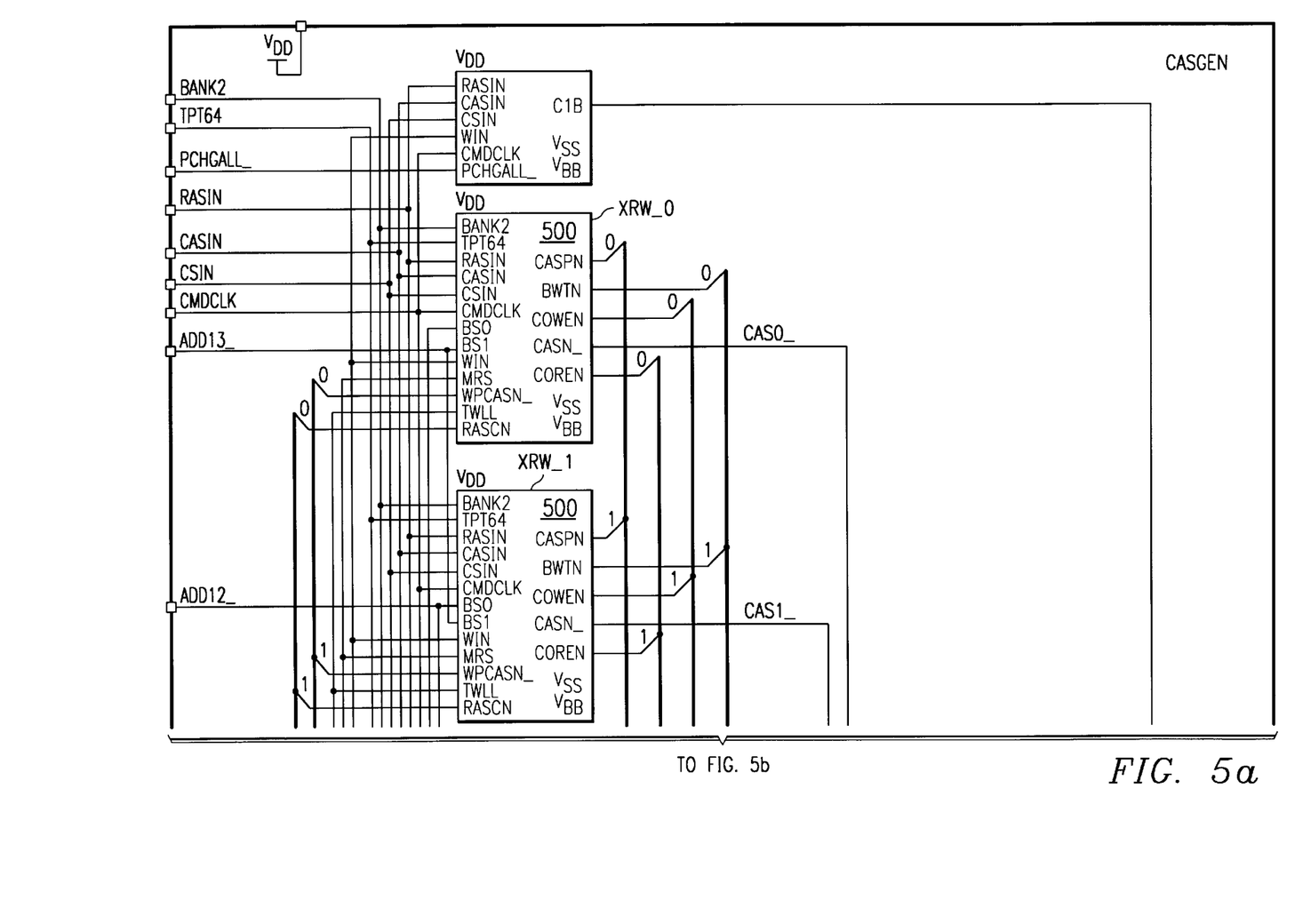
FIGS. 5a, 5b, and 5c are sections of a schematic diagram of the column control block of FIG. 1.
Figure 5B:
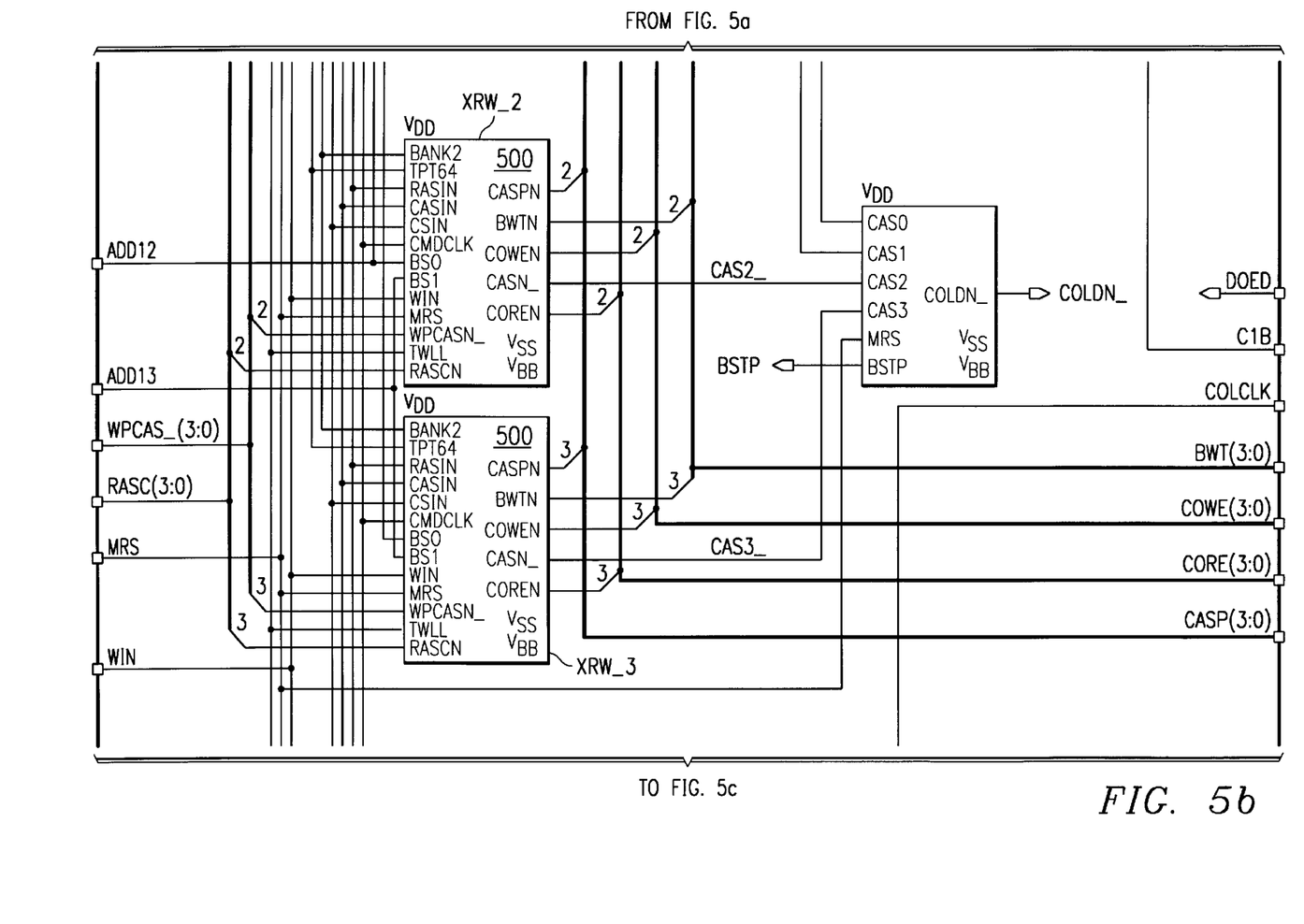
Figure 5C:
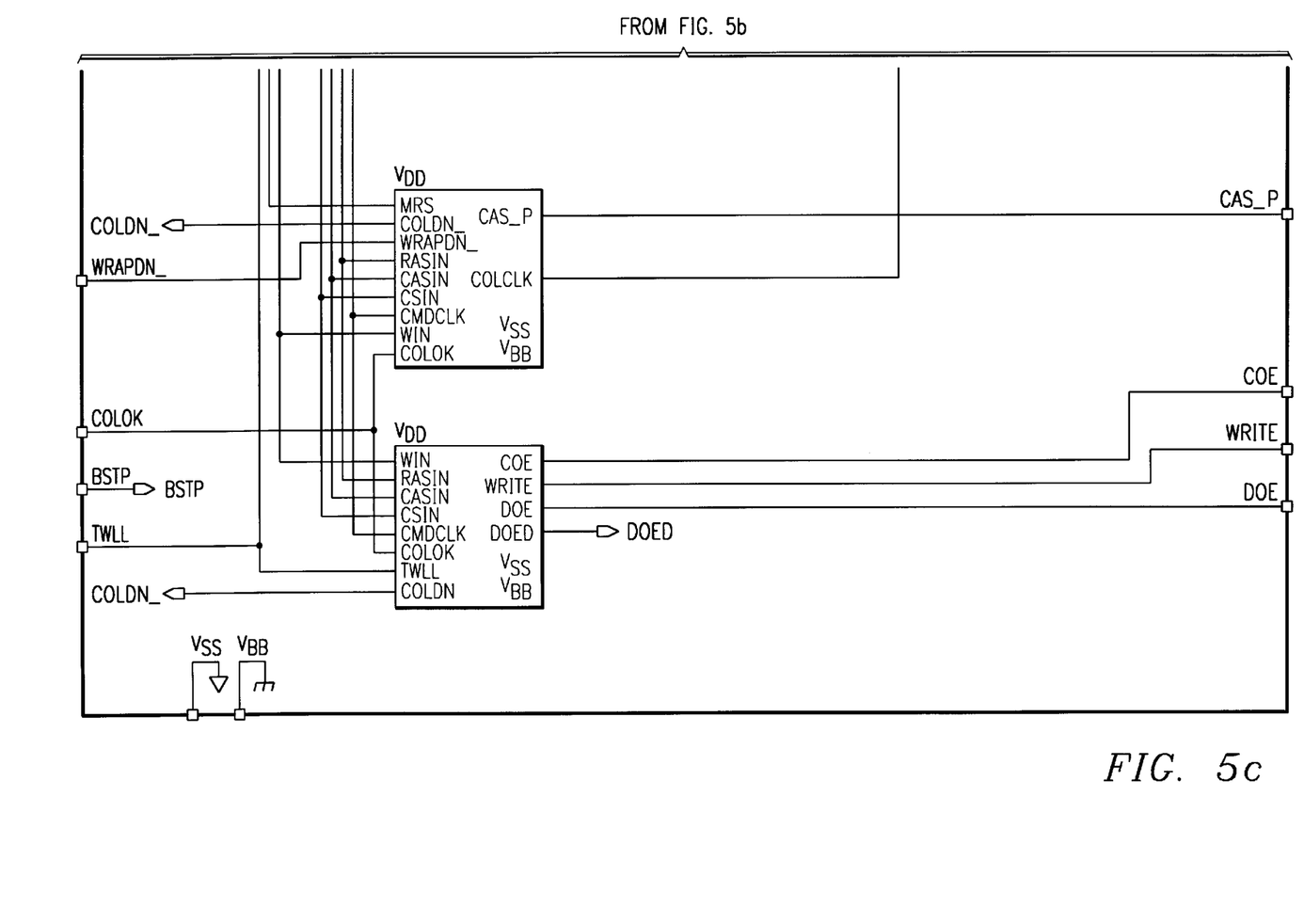

FIGS. 3 and 4 are schematic diagrams of the circuitry in the row control block 100 shown in FIG. 1. The ACTVGEN block shown in FIG. 3 includes three sets of decode circuitry. The first set of circuitry, XACTV, produces the RASn signal that activates the word lines in the memory array. A separate XACTV circuit exists for each of the four banks (bank 0, bank 1, bank 2, and bank 3). The second circuit, XBNKACTV, indicates whether a row in one of the banks has been activated, that is, whether any of RAS0, RAS1, RAS2, or RAS3 are logic highs. The third set of circuitry, XRASCBR, enables a column path for a given bank, but is not allowed to activate during a refresh cycle.

The RASIN, CASIN, CSIN, and WIN signals at the input to the circuitry shown in FIG. 3 are internally latched versions of the RAS_, CAS_, CS_, and W_ signals that are input on external pins of the memory circuit. RAS_ is the row address strobe that activates the word lines in the array. CAS_ is the column address strobe that activates the bit lines in the array. CS_ is the chip select enabling signal that is common to synchronous DRAMs, and W_ is the write signal. The ADD12 and ADD12_ (complement of ADD12) lines in conjunction with the ADD13 and ADD13_ (complement of ADD13) lines allow for selection between banks 0, 1, 2, and 3 when the circuit is in its normal four-bank configuration. The CBR line carries the refresh signal that rewrites the data in a particular row within one of the banks. The MRS line carries a signal from the mode register that is common to synchronous DRAMs and is used here as a generic reset function. BANK2 is the signal referred to in FIG. 2 that determines whether the memory circuit functions as a four-bank array or a two-bank array.

FIG. 4 is a schematic diagram of one of the XACTV circuits 300 of FIG. 3. The BS0 line is connected to ADD12 or ADD12_ depending on which of the four XACTV circuits is involved. As shown in FIG. 3, ADD12 is connected to the BS0 line of XACTV_1 and XACTV_3, while ADD12_ is connected to the BS0 line of XACTV_0 and XACTV_2. Similarly, the BS1 line for each XACTV circuit is connected to either ADD13 or ADD13_. Referring again to FIG. 3, ADD13 is connected to the BS1 line of XACTV_2 and XACTV_3, while ADD13_ is connected to the BS1 line of XACTV_0 and XACTV_1. This arrangement of connections facilitates the division of the normal array division of four banks into two banks. As is made clear in the truth table of FIG. 4a, toggling ADD13 (BS1) between a logic low and a logic high switches between grouped banks 0 and 1 or banks 2 and 3. Thus, grouped banks 0 and 1 may be viewed as one bank in a two-bank configuration, while banks 2 and 3 may be viewed as the second bank. As is also apparent from the truth or connection table of FIG. 4a, toggling ADD12 (BS0) switches between the now sub-banks 0 and 1 and sub-banks 2 and 3 in the two-bank configuration.

The four-bank array is made to function as a two-bank array as follows. As described above, connecting the bond pad 200 shown in FIG. 2 to a logic high voltage results in a BANK2 signal that is a logic high. The RASM signal of FIG. 4 is the RASN signal from the opposite sub-bank. The phrase "opposite sub-bank" refers for example to bank 1 when considering bank 0, or bank 3 when considering bank 2, or vice versa in each of the two grouped sets of banks. This is made clear by referring to lines 302 in FIG. 3, where the RASN output line of XACTV_0 is tied to the RASM input port of XACTV_1; the RASN output line of XACTV_1 is tied to the RASM input port of XACTV_0; the RASN output line of XACTV_2 is tied to the RASM input port of XACTV_3; and the RASN output line of XACTV_3 is tied to the RASM input port of XACTV_2.

The logic high BANK2 signal is combined with the RASM signal by NAND gate ND4. ND4 produces a logic low only if RASM is also high. The logic low from ND4 ensures that the BS0 signal does not influence the output RASN because of NAND gate ND5. The only bank select function active if both RASM and BANK2 are high is BS1, which is connected to ADD13 or ADD13_. A logic low RASM indicates that the opposite sub-bank is not signaling for the activation of a row, so the output of ND4 is high and BS0, which is connected to ADD12 or ADD12_ is able to influence whether RASN goes high, thereby activating a row within the sub-bank corresponding to the XACTV circuit being considered.

The tying of the output to the input of the XACTV circuits within the grouped banks 0 and 1 and banks 2 and 3 ensures that a row is active only in bank 0 or 1 or bank 2 or 3 at a given time. By preventing the simultaneous activation of rows in both banks 0 and 1, that group of banks is allowed to function as a single bank. The same is true for banks 2 and 3. As mentioned above, ADD13 (BS1) is uninfluenced by the BANK2 signal and therefore is able to freely provide selection between the grouped banks so that, functionally speaking, the selection of banks appears externally to be between two banks instead of four.

While the circuitry described with reference to FIGS. 3 and 4 pertains to the selection of rows or wordlines within the memory array banks, the circuits of FIGS. 5a, 5b, and 5c (referred to collectively herein as FIG. 5) and 6 pertain to the selection of columns or bitlines within the array banks, and more particularly to the coordination of read and write functions that detect the data in the array and input new data into the array, respectively. The CASGEN circuit block 102 of FIG. 1 is shown in detail in FIG. 5. The XRW blocks 500 are bank-specific read/write decode circuitry. As in the ACTVGEN circuit block of FIG. 3, the XRW blocks are connected to the BANK2, ADD12, ADD12_, ADD13, and ADD13_ lines. ADD12 is connected to the BS0 line of XRW_0 and XRW_2, while ADD12_ is connected to the BS0 line of XRW_1 and XRW_3. Similarly, the BS1 line for each XRW circuit is connected to either ADD13 or ADD13_. Referring again to FIG. 5, ADD13 is connected to the BS1 line of XRW_2 and XRW_3, while ADD13_ is connected to the BS1 line of XRW_0 and XRW_1. Hence, upon receiving a high BANK2 signal, the read and write functions are coordinated with the division of banks 0 and 1 into a new first bank, and banks 2 and 3 into a new second bank. Outputs of the CASGEN circuit shown in FIG. 5 include COWE(3:0) and CORE(3:0), which are bank-specific write and read signals, respectively. The input, WPCAS_(3:0) resets CORE and COWE at the end of a data burst.

Figure 6:
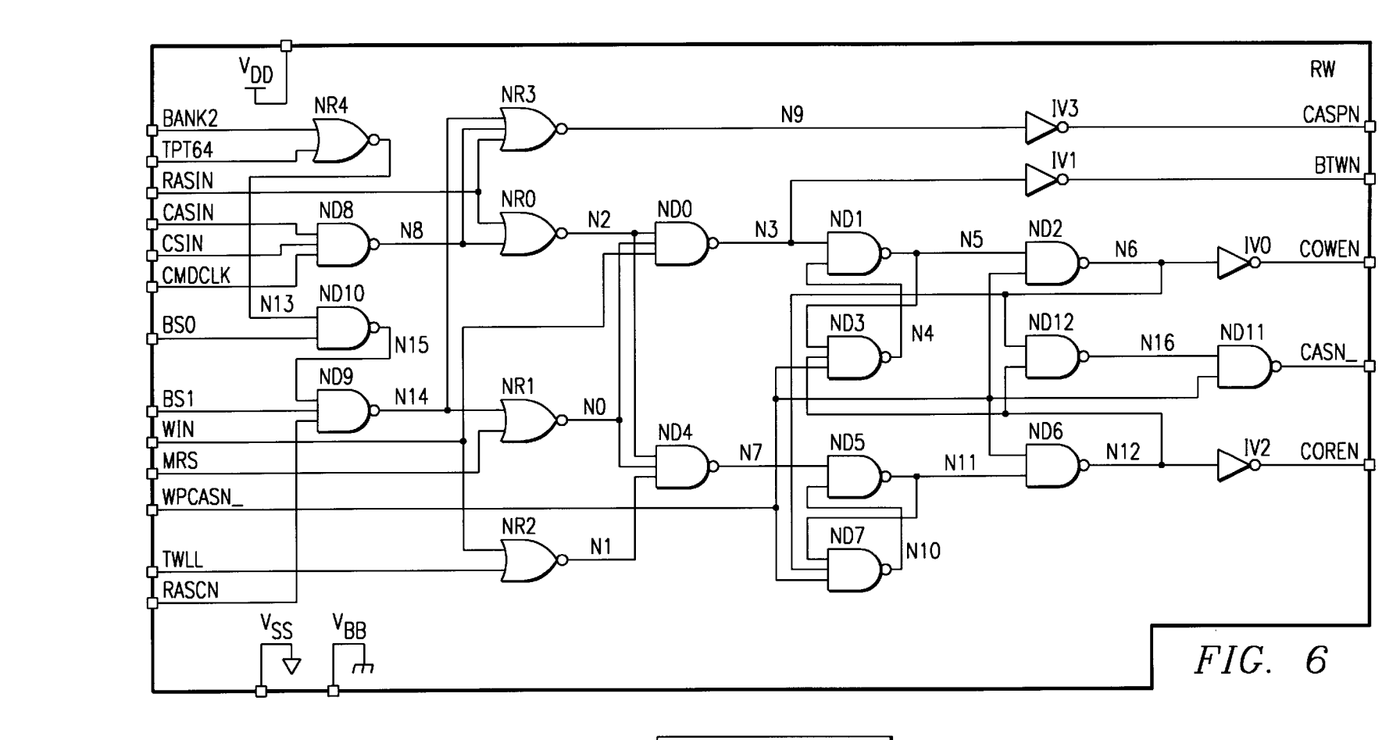
FIG. 6 is a schematic diagram of the XRW blocks of FIG. 5.

FIG. 6 is a schematic diagram of one of the XRW circuit blocks 500 shown in FIG. 5. As in the circuit of FIG. 4, a BANK2 signal that is a logic high prevents the ADD12 or ADD12_ signal connected at line BS0 from influencing the logic level of the COWEN and COREN output signals. This is accomplished as shown by inverting the BANK2 signal in NOR gate NR4. It should be noted that TPT64 is a test input that allows the triggering of the two-bank configuration circuitry for test purposes. TWLL is a similar test signal that prevents a read command.

Figure 6A:
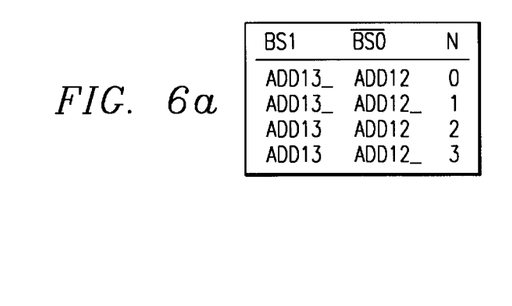
FIG. 6a is a truth or connection table for addressing the circuit of FIG. 6.

The low logic level output of NR4 serves to make the logic level at node N15 high no matter what the BSO (ADD12 or ADD12_) logic level is. Hence, once the BANK2 signal goes high, the only bank-specific control is with ADD13 or ADD13_, which are connected to BS1. So, a read or write command given when BANK2 is high results in a column address in the new bank comprising banks 0 and 1, or in the new bank comprising banks 2 and 3. With BANK2 high, there is no independent column access between banks 0 and 1, or between banks 2 and 3. The truth or connection table of FIG. 6a indicates that a high logic level ADD13_ (or a low ADD13) at BS1 selects the bank that includes the former banks 0 and 1, while a high logic level ADD13 (or low ADD13_) selects that bank that includes the former banks 2 and 3.

If the BANK2 signal is a logic low (corresponding to a floating bond pad 200 in FIG. 2) the memory array configuration is four banks and both the ADD12 and ADD13 signals (and their complements) are used to select the bank for the reading or writing of information. All of the columns of banks 0, 1, 2, or 3 may be accessed independently when BANK2 is at a low logic level. Truth or connection table FIG. 6a indicates the signals that should be made high to select banks 0, 1, 2, or 3.

Figure 7:
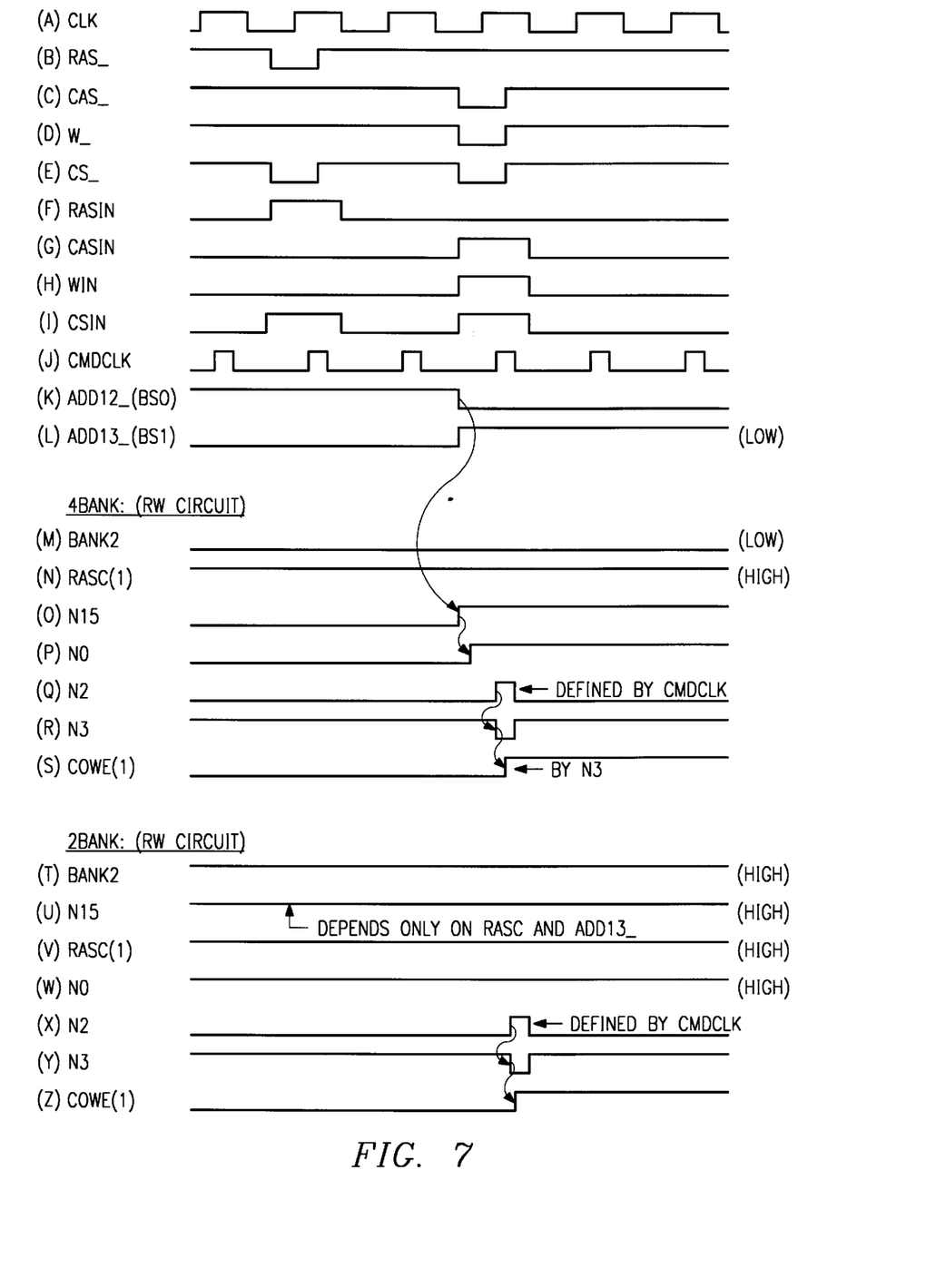

FIG. 7 is a timing diagram of the progression of signals through the XRW circuit block shown in FIG. 6. The particular example shown in FIG. 7 is for the actuation of the COWE (write) signal for bank 1. The signals (a) through (e) are provided externally to the memory circuit; while signals (f) through (i) are versions of (a) through (e) that are latched internally in the memory circuit (hence the longer periods of signals (f) through (i) as compared to (a) through (e)). Signal (j) is an internal version of the external clock (a). Signals (k) and (l) are of course the signals used to select banks within the memory array. Signals (m) through (s) illustrate the signal progression within the circuitry in four-bank mode, while signals (t) through (z) illustrate the two-bank mode signal progression.

The ADD12_ signal transitions to a low voltage level and the ADD13_ transitions to a high voltage level as shown in lines (k) and (l) of FIG. 7. Referring to the truth table of FIG. 6a, it is apparent that the bank addressed by these levels is bank 1. In line (m) the BANK2 signal is low, which is consistent with the array being in four-bank mode. The RASC(1) signal in line (n) produced by the ACTV circuitry of FIG. 3 is high. Nodes N15 and N0 go high with the change of ADD12_ and ADD13_. Node N2 depends primarily on the CASIN, CSIN, and CMDCLK signals of lines (g), (i), and (j), respectively. Since those signals are high, node N2 is high as shown in line (q). The voltage on node N3 depends on the voltages at nodes N2, N0, and the signal WIN (line (h)). WIN is high when a write command has been issued. NAND gates ND1 and ND2 perform inversions on the signal at node N3, as does inverter IV0. The result is a high signal for COWE for bank 1. Thus, the signals shown in the timing diagram prepare bank 1 for data to be written into a memory cell within that bank as selected by row and column addresses.

Lines (t) through (z) of FIG. 7 show the progression of signals to generate a COWE signal from the XRW circuitry of FIG. 6 with the array in two-bank mode. The BANK2 signal of line (t) is high, which is consistent with the choice of two-bank mode. With BANK2 high, node N13 of FIG. 6 is always low, which in turn makes node N15 always high as shown in line (u). As in line (n), the RASC1 signal is high for the ADD12_ and ADD13_ signal conditions shown in lines (k) and (l). Since all of the inputs to NAND gate ND9 are high, node N14 is low and node N0 is high independent of the toggling of ADD12_ on BS0. Node N2 is high as described above with regard to the four-bank mode operation. Since all of the inputs to NAND gate ND0 are high, N3 is low and COWE(1) is high as described above for the four-bank operation, and bank 1 is once again made ready for the writing of data.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments described involve a 64 Mb memory array configured in four banks, selectable to two banks. It will be appreciated that memory circuits larger than 64 Mb and having more or fewer banks than four banks will benefit from the techniques described. Further, it is evident that similar techniques can be applied to increase the number banks in the memory array, as opposed to decreasing the number. Still further, it will be appreciated that the relative logic levels (low or high) chosen in the embodiments may be reversed with corresponding changes to the logic circuitry and still preserve the functions described. It is therefore intended that the appended claims encompass any such modifications or embodiments.

What is claimed is:

1. A memory circuit, comprising:

a bond option circuit having an input and an output;

row control circuitry coupled to said output of said bond option circuit, said row control circuitry including address terminals;

column control circuitry coupled to said output of said bond option circuit, said column control circuitry including address terminals;

a memory cell array coupled to said row control and column control circuitry, said memory cell array arranged in a first plurality of banks of memory cells, said banks selectable by a combination of address signals on said address terminals of said row control and column control circuitry;

wherein responsive to a first signal at said input of said bond option circuit, said bond option circuit produces a second signal at said output of said bond option circuit that is coupled to said row control and column control circuitry;

said row control and column control circuitry responsive to said second signal such that said banks are selectable in a second plurality.

2. The circuit of claim 1, wherein said first plurality is four and said second plurality is two.

3. An integrated circuit, comprising:

a memory array arranged in a plurality of banks of memory cells, each bank of memory cells arranged in rows and columns of memory cells;

a programmable circuit having an input terminal selectively connected to a voltage terminal when the integrated circuit is manufactured and having an output terminal, the output terminal providing a first output signal when the input terminal is connected to the voltage terminal and providing a second output signal when the input terminal is not connected to the voltage terminal; and a control circuit coupled to the memory array and to the output terminal of the programmable circuit and coupled to receive a plurality of control signals and a clock signal, the control circuit arranged for simultaneously selecting a first bank and a second bank of the plurality of banks in response to one of the first and second output signals, the control circuit arranged for selecting the first bank and not the second bank of the plurality of banks, in response to the other of the first and second output signals.

4. An integrated circuit as in claim 3, wherein the input terminal is selectively connected to the voltage terminal by a bond wire.

5. An integrated circuit as in claim 3, wherein the control circuit comprises a row control circuit, the row control circuit arranged for simultaneously selecting at least one row of memory cells from each of the first bank and the second bank in response to one of the first and second output signals and a first address signal, the row control circuit arranged for selecting at least one row of memory cells from the first bank and not the second bank, in response to the other of the first and second output signals and a second address signal.

6. An integrated circuit as in claim 5, wherein said simultaneously selecting at least one row of memory cells from each of the first bank and the second bank includes selecting the at least one row of memory cells from one of the first and second banks then selecting the at least one row of memory cells from the other of the first and second banks.

7. An integrated circuit as in claim 5, wherein one of the first and second address signals includes at least one more address bit than the other of the first and second address signals.

8. An integrated circuit as in claim 6, wherein the input terminal is selectively connected to the voltage terminal by a bond wire.

9. An integrated circuit as in claim 8, wherein the control circuit further comprises a column control circuit, the column control circuit arranged for simultaneously selecting at least one column of memory cells from each of the first bank and the second bank in response to one of the first and second output signals, the column control circuit arranged for selecting at least one column of memory cells from the first bank and not the second bank, in response to the other of the first and second output signals.

10. An integrated circuit as in claim 3, further comprising an address circuit coupled to receive a plurality of address bits, the address circuit arranged for selecting at least one row of memory cells in only a first bank of memory cells in response to said one of the first and second output signals and the plurality of address bits, the address circuit arranged for selecting at least one row of memory cells in one of the first bank and a second bank of memory cells in response to said other of the first and second output signals, the plurality of address bits, and at least one other address bit.

11. An integrated circuit as in claim 3, wherein the control circuit is coupled to receive at least one of said plurality of control signals from a mode register.

12. An integrated circuit as in claim 11, wherein the control circuit is arranged to produce a plurality of row address control signals in synchronization with the clock signal, responsive to said at least one of said plurality of control signals, each row address control signal corresponding to a respective bank of memory cells.

13. An integrated circuit as in claim 12, wherein the control circuit is arranged to inhibit production of a second row address control signal of the plurality of row address control signals by the production of a first row address control signal of the plurality of row address control signals in response to the other of the first and second output signals.

14. An integrated circuit as in claim 13, wherein the memory cells are dynamic random access memory cells.

15. An integrated circuit, comprising:

a memory array having a plurality of N banks of memory cells, each bank of memory cells arranged in rows and columns of memory cells;

a selection circuit having an input terminal selectively connected to a voltage terminal when the integrated circuit is manufactured and having an output terminal, the output terminal providing an output signal having a first logic level when the input terminal is connected to the voltage terminal and having a second logic level when the input terminal is not connected to the voltage terminal; and a control circuit coupled to receive a plurality of control signals, a clock signal and the output signal, the control circuit arranged to select N banks of memory cells at a first time in response to one of the first and second logic levels, the control circuit arranged to select no more than N/2 banks of memory cells at a second time in response to the other of the first and second output signals.

16. An integrated circuit as in claim 15, wherein the control circuit is arranged to separately select each bank of the N banks of memory cells until all N banks are selected at said first time in response to said one of the first and second logic levels, the control circuit arranged to separately select each bank of the N/2 banks of memory cells until all N/2 banks are selected at said second time in response to said other of the first and second output signals.

17. An integrated circuit as in claim 16, further comprising an address circuit coupled to the control circuit and the memory array and coupled to receive an address signal, the address circuit arranged to activate at least one word line in each of the N banks at said first time in response to said one of the first and second logic levels, the address circuit arranged to activate at least one word line in each of the N/2 banks at said second time in response to said other of the first and second logic levels.

18. An integrated circuit as in claim 15, wherein the control circuit is coupled to receive at least one of said plurality of control signals from a mode register.

19. An integrated circuit as in claim 18, wherein the control circuit is arranged to produce a plurality of row address control signals in synchronization with the clock signal, responsive to said at least one of said plurality of control signals, each row address control signal corresponding to a respective bank of memory cells.

20. An integrated circuit as in claim 19, wherein the control circuit is arranged to inhibit production of a second row address control signal of the plurality of row address control signals by the production of a first row address control signal of the plurality of row address control signals in response to the other of the first and second output signals.

* * * * *